United States Patent

Peng et al.

[11] Patent Number: 5,895,223
[45] Date of Patent: Apr. 20, 1999

[54] METHOD FOR ETCHING NITRIDE

[75] Inventors: Lung-Han Peng; Chih-Wei Chuang; Jin-Kuo Ho, all of Taipei; Chin-Yuan Chen, Hsinchu, all of Taiwan

[73] Assignee: Industrial Technology Research Institute, Hsinchu, Taiwan

[21] Appl. No.: 08/988,301

[22] Filed: Dec. 10, 1997

[51] Int. Cl.⁶ .................................................. H01L 21/302
[52] U.S. Cl. .............................. 438/18; 438/18; 438/746; 438/752; 204/129.3
[58] Field of Search ........................ 204/129.1, 129.2, 204/129.3; 438/17, 18, 746, 752

[56] References Cited

U.S. PATENT DOCUMENTS 4,613,417  9/1986  Laskowski et al. ............... 204/129.85
4,995,939  2/1991  Ferenczi et al. .................... 156/627

FOREIGN PATENT DOCUMENTS 8-213358  8/1996  Japan .

OTHER PUBLICATIONS

M.N. Ruberto et al., "The Laser-Controlled Micrometer-Scale Photoelectrochemical Etching of III-V Semiconductors," J. Electrochem. Soc., vol. 138, No. 4, pp. 1174–1185 (1991).

M.S. Minsky et al., "Room-temperature photoenhanced wet etching of GaN," Appl. Phys. Let., vol. 68, No. 11, pp. 1531–1533 (1996).

H. Lu et al., "Photoassisted Anodic Etching of Gallium Nitride," J. Electrochem. Soc., vol. 144, No. 1, L8–L11 (1997).

C. Youtsey et al., "Broad-area photoelectrochemical etching of GaN," Electronics Letters, vol. 33, No. 3, pp. 245–246 (1997).

"Pulsed Electrochemical Etching of (In,Ga)N/GaN LED Material"; Proc. SPIE—Int. Opt. Soc. Eng. (1997'); V3002; pp. 11–14; Jeongseok et al.

"Room-Temperature Photoenhanced Wet Etching of GaN"; Minsky et. al.; Mar. 1996'; Appl. Phys. Lett. 68(11); pp. 1531–1533.

"Electrochemical Etching of A Conductive GaN Crystal For Patterning"; Yoshida; J. of Crystal Growth; 181(3); 1977'; pp. 293–296.

"Photoassisted Anodic Etching of Gallium Nitride"; Lu et. al.; J. Elect. Soc.; V144(1); pp. L8–L11; Jan. 1997'.

Primary Examiner—R. Bruce Breneman
Assistant Examiner—George Goudreau
Attorney, Agent, or Firm—Ladas & Parry

[57] ABSTRACT

A method for etching nitride is provided, by which the etching rate and the roughness of the etching surface can be powerfully controlled, and by which the etching depth can be in-situ monitored. The etching method comprises the steps of: (i) coating a first electrode on a nitride chip; (ii) mounting the nitride chip on a holding device; (iii)dipping the holding device, the nitride chip and the first electrode in electrolysis liquid; (iv) irradiating the nitride chip with a UV light having a wavelength shorter than 254 nm; and (v) connecting the first electrode to a second electrode dipped in the electrolysis liquid by a galvanometer to in-situ monitor the etching current, so as to in-situ control the etching depth.

15 Claims, 4 Drawing Sheets

METHOD FOR ETCHING NITRIDE

BACKGROUND OF THE INVENTION

1. Field of the Invention

The present invention relates to a method for etching nitride, and more particularly to a wet-etching method for nitride enhanced by utilizing UV light.

2. Description of Prior Art

Using III-V group semiconductors to manufacture light-emitting devices is a well-known prior art. The procedure of manufacturing light-emitting devices is similar to that of manufacturing Si-based devices, which comprises epitaxy, photolithography, etching, diffusion and coating, etc. However, due to the difference of semiconductor materials, each procedure mentioned above needs to be modified when manufacturing a device with different semiconductor materials. Particularly in the etching step, different materials result in very different ways of etching. For example, the photoelectrochemical (PEC) etching technology disclosed in *J. Electrochem. Soc.* 138, pp. 1174–1185 (1991) by M. N. Rubert et al., which incorporates the effect of visible light and chemical matter, has been widely applied to the etching of narrow energy band III-V group semiconductor materials such as GaAs or InP.

However, only three prior arts are disclosed applying the photoelectrochemical etching technology to wide energy band semiconductor materials such as GaN (gallium nitride). The first one is "Room-temperature photoenhanced wet etching of GaN," *Appl. Phys. Lett.* 68, pp. 1531–1533 (1996) disclosed by M. S. Minsky et al., which employs a He-Cd laser (570 mW/cm$^2$, 325 nm) while etching under no bias voltage. The second one is "Photoassisted anodic etching of GaN," *J. Electrochem. Soc.* 144, L8–L11(1997) disclosed by H. Lu et al., which applies mercury lamps of 60 mW/cm$^2$ at 365 nm and 150 mW/cm$^2$ at 405 nm to the etching under bias. The third one is "Broad-area photoelectroch. etching of GaN," *Elec. Lett.* 33, pp. 245–246 (1997) disclosed by Youtsey et al., which uses unfiltered mercury lamps of 6.4 mW/cm$^2$ at 320 nm, 7.4 mW/cm$^2$ at 365 nm and 13.2 mW/cm$^2$ at 405 nm as light sources to work in the etching under no bias voltage.

In the prior arts above, the drawbacks of Minskey et al. to are that the effective area of the laser spot working on GaN is too small, normally only 1 mm$^2$, and that the mode distribution of the incident light after passing through the glass wall of the vessel containing etching liquid is not spatially uniform. These drawbacks cause inferior yield and degrade performance during the fabrication of light-emitting devices.

Regarding to Lu et al., the wavelengths of the incident light used in etching are 365 nm and 405 nm, both longer than the energy band absorption of GaN that is 3.4 eV, i.e. 364.7 nm. In this case, the function of the bias voltage is similar to the anode electrolysis of electrochemistry. The mercury lamp of 365 nm or 405 nm is only used to provide heat during the etching process.

As to Youtsey et al., the manufacturing process suffers from variation in etching depth. Taking a sample of 0.5×1 cm$^2$ for example, the variance of etching depth is 20–30% when the impurity concentration is about 10$^{18}$cm$^{-3}$, and up to 80% when the impurity concentration is about 10$^{19}$cm$^{-3}$.

Each of the three prior arts has the following drawbacks: the roughness of the etching surface is around 100 nm under the conditions in each prior art. However, such a roughness will cause remarkable optical loss and degrade the efficiency of light-emitting devices for laser diodes having a wavelength less than 450 nm.

SUMMARY OF THE INVENTION

It is therefore an object of the present invention to provide a method for etching nitride, which overcomes the drawbacks and disadvantages associated with the prior arts mentioned above.

According to the present invention, the method for etching nitride is a wet-etching technique for etching InGaAlN, which is enhanced by the illumination of 254 nm UV light.

An aspect of the present invention is to provide an etching method in which the etching rate, the roughness of the etching surface and the uniformity of the etching depth can be powerfully controlled.

Another aspect of the present invention is to provide an etching method, which can be used in the manufacturing process of wafers larger than 2 inches.

The other aspect of the present invention is to provide an etching method in which the etching depth can be in-situ monitored.

The present invention utilizes an UV light of 254 nm to irradiate the surface of nitride while the nitride is being etched, thereby generating hot electron-hole pairs. The hot hole takes part in the oxidation of GaN to form oxide. The hot electron forms a closed circuit with the metal conductor and the ions in the electrolysis liquid. In this manner, not only can the variation in roughness of the etching surface be reduced, but also the etching depth can be in-situ monitored by measured the etching current. The method of this invention can be adopted in industrial mass-production and has the advantages of easy operating, low maintenance cost and high yield.

BRIEF DESCRIPTION OF THE DRAWINGS

The following detailed description, given by way of example and not intended to limit the invention solely to the embodiments described herein, will best be understood in conjunction with the accompanying drawings in which.

DETAILED DESCRIPTION OF THE PREFERRED EMBODIMENTS

Figure 1:
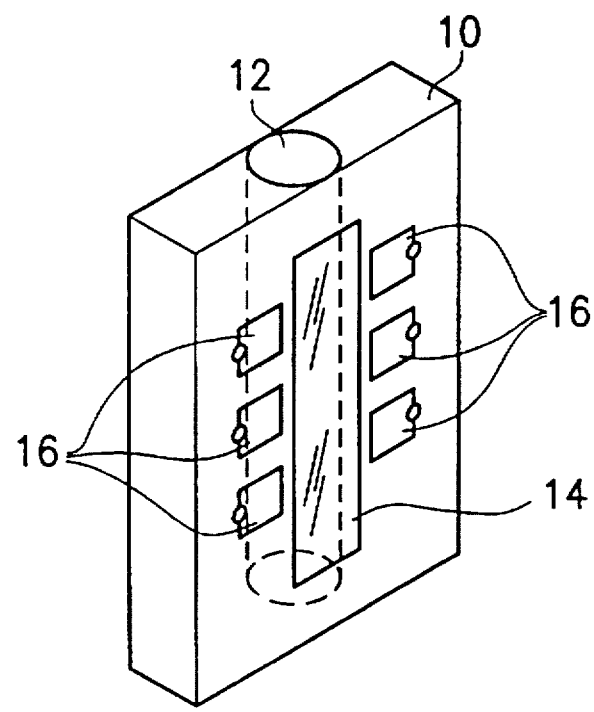
FIG. 1 illustrates a perspective view of a holding device applied in the present invention.

In order to fix a nitride chip and provide a light source to irradiate the nitride chip at the time the nitride is etched, as shown in FIG. 1, a holding device is used in the etching method of this invention, which comprises: an insulating substrate 10, in which a cavity 12 is formed for mounting a light source; a window 14 formed on the insulating substrate 10 to permit the light generated by the light source embedded in the cavity 12 to be emitted from the insulating substrate 10; and a plurality of clamps, formed beside the window 14, for holding a nitride chip.

The insulating substrate 10 can be made of Teflon. The cavity 12 can be formed by inserting a quartz tube in the insulating substrate 10. The light emitted by the light source can be transmitted through the quartz tube and the window to the exterior. The wavelength (frequency) of the light source must meet the requirement that the energy hv of the light is greater than the energy band difference $E_g$ between the conductive band and the covalence band of nitride.

Wherein h indicates the Planck constant and v represents the frequency of the light source. Thus the electrons in nitride can be excited from the covalence band to the conductive band, producing hot electrons to form a closed circuit in the etching vessel.

Figure 2:
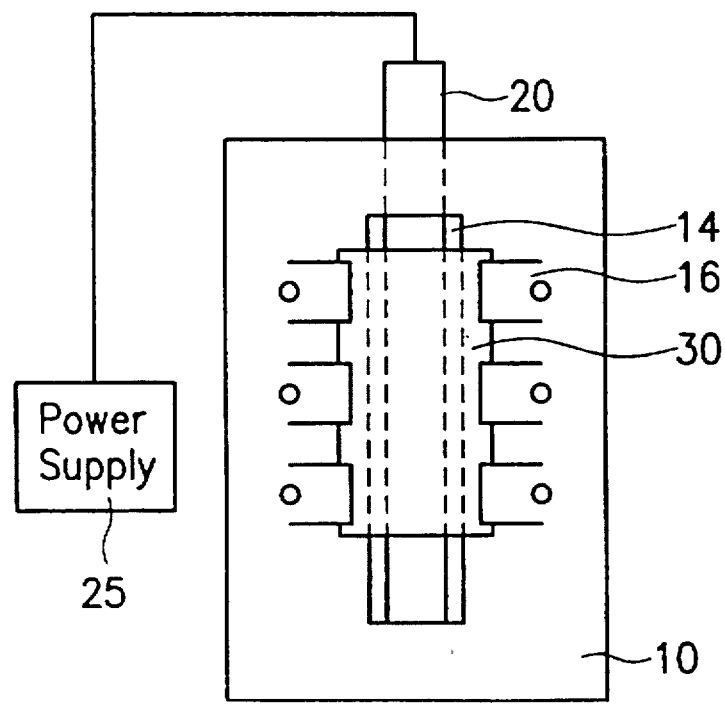
FIG. 2 is a front view of a holding device that provides illumination to irradiate the nitride according to the present invention.

Refer to FIG. 2, which is a front diagram of the holding device as shown in FIG. 1. According to this embodiment, in the cavity 12 of the insulating substrate 10, a mercury lamp 20 having a wavelength of 254nm is mounted. The nitride chip 30 such as GaN, GaInAlN and so on can be fixed on the insulating substrate 30 by the plurality of clamps 16. Further, one side of the nitride chip 30 faces against to the window 14, the UV light emitted from the mercury lamp 20 can illuminate the nitride chip 30 through the window 14. In addition, the power supply 25 provides the power that the mercury lamp needs to irradiate.

Figure 3:
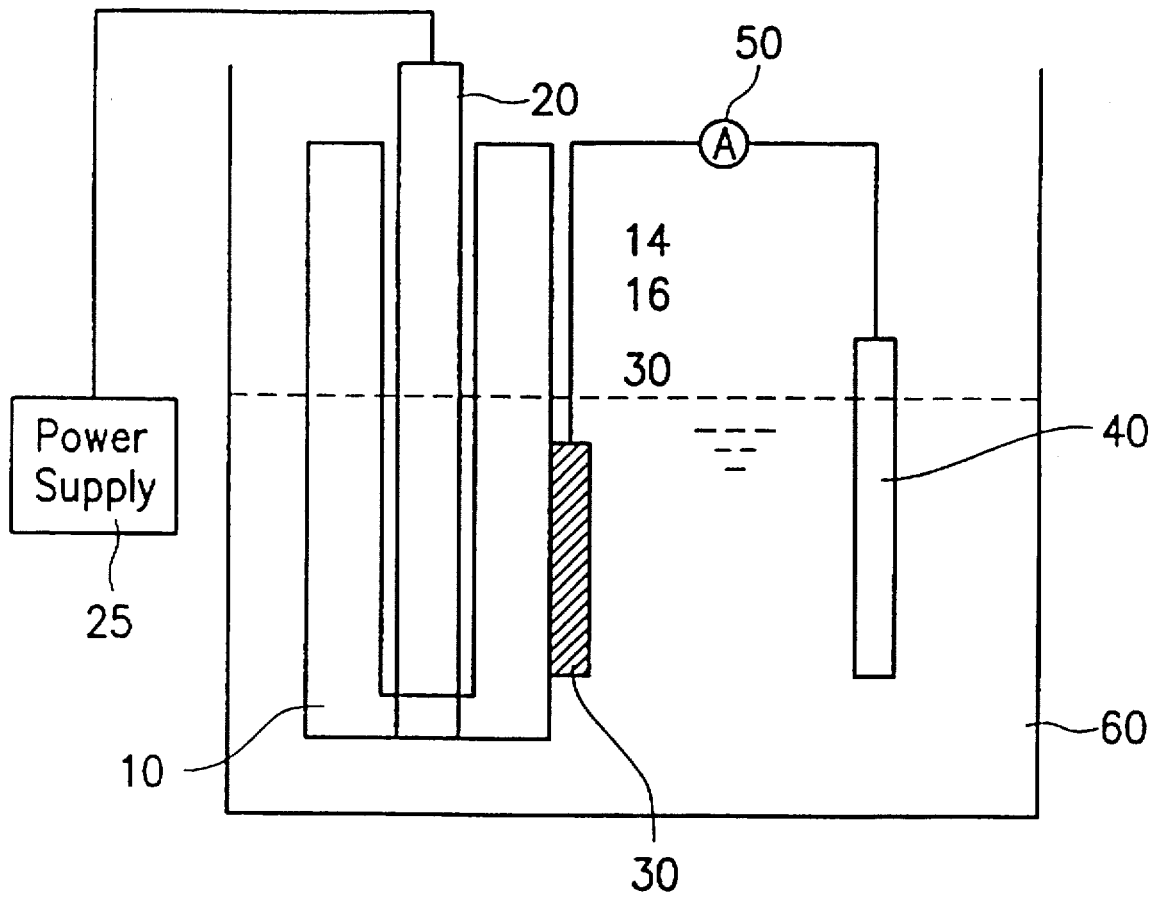
FIG. 3 is a diagram illustrating the structure of the apparatus implementing a method for etching nitride according to the present invention.

FIG. 3 illustrates the structure implementing the method for etching nitride according to this invention, which includes: an etching vessel 60 containing the electrolysis liquid; a holding device 10 of FIG. 2, in which a mercury lamp 20 is disposed, partially dipped in the electrolysis liquid, thus the nitride chip 30 clamped on the holding device 10 is completely dipped in the electrolysis liquid; a metal conductor 40 partially dipped in the electrolysis liquid, and connected to the nitride chip 30 through a galvanometer 50.

By utilizing the apparatus shown in FIG. 3, the etching method of this invention comprises the steps of: (i) mounting the nitride chip 30 on the holding device 10; (ii) dipping the holding device 10 and the nitride chip 30 in the electrolysis liquid; (iii) emitting a UV light with a wavelength of 254 nm to illuminate the nitride chip 30; (iv) measuring the etching current, i.e. the current in the closed circuit, so as to in-situ monitor the etching depth.

In the embodiment described above, the power density of the mercury lamp emitting the light with a wavelength of 254 nm is only 10 nW/cm$^2$, which is far less than several hundreds or even a thousand mW/cm$^2$ used in the prior art.

The above embodiment of this invention can be modified to constitute a different embodiment. That is, if the etching vessel is made of a material that will not absorb UV light, then the mercury lamp can be placed outside the etching vessel. However, the activation of the etching liquid by the UV light and the absorption of the UV light by the etching liquid must be avoided when the etching is proceeding. Furthermore, the shortest wavelength of the mercury lamp used in the above embodiment is 254 nm. The light source utilized in this invention is not limited in the mercury lamp, but can be any other device that emits light with a shorter wavelength, such as a deuterium lamp, or the converting output of a frequency quadrupled quasi-molecular laser, e.g. KrF 248 nm, ArF 193 nm, and $F_2$ 157 nm excimer laser, or a YAG laser (1064 nm). Regarding the holding device, because there is no need to provide a light source in this embodiment, any holding device that can fix the nitride chip and does not block the UV light from illuminating the nitride chip can be used in the present invention.

For the etching method of this invention, the pH value of a solution that is used as etching liquid should be greater than 11 or less than 3. For example, the electrolysis liquid can be one of KOH, HCl and $H_3PO_4$ as the nitride chip is GaN.

Moreover, on the nitride chip must be a partially coated metal electrode. The work function of the metal electrodes must be greater than the electronic affinity of the nitride. The metal electrode can be a dual-layer electrode such as Pt/Ti alloy to raise the etching rate. The requirement for the dual-layer electrode is that the work function of the outer electrode should be greater than that of the inner electrode. Therefore, the inner electrode can be one of Ti, V, Cr, Zr, Mo, Hf, Ta and W and a composition thereof while the outer electrode is Re, Pt, Ru, Rh, Pd, Au, Ir and Ni and a composition thereof.

The etching method of this invention offers a finer roughness for an etching surface compared with the prior art. The roughness resulted in the prior art is about 100 nm. However, while etching GaN with a depth of 400 nm, its surface roughness is only raised to 4 nm.

Figure 4:
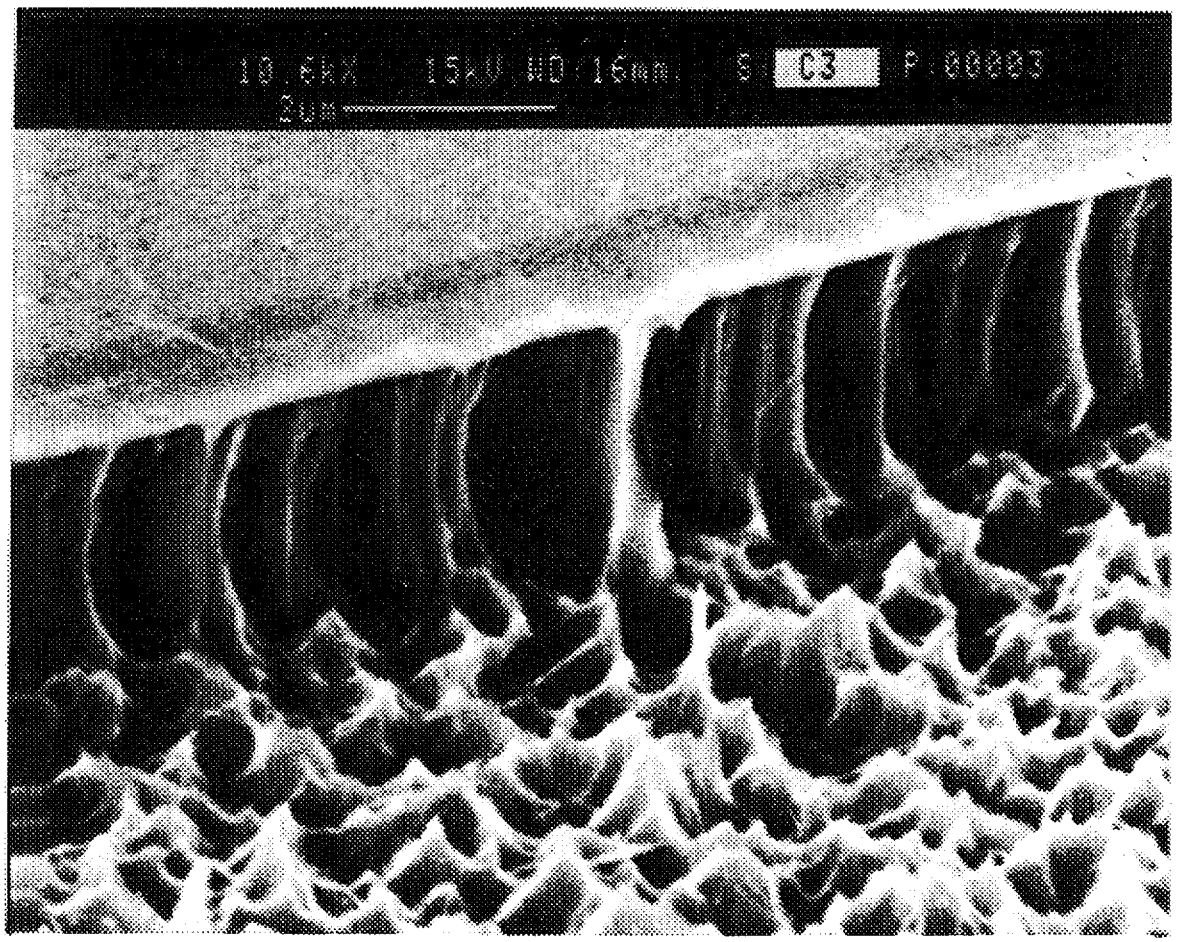
FIG. 4 is an SEM photograph illustrating an embodiment of etching a GaN chip according to this invention.

Referring to FIG. 4, the photograph is a SEM photo illustrating an embodiment of etching a GaN chip according to this invention. In this embodiment, the etching liquid is $H_3PO_4$ with a pH value of 2. The ratio of illuminated area to non-illuminated area of the nitride chip is 5:1. The power density of the light source is 10 mW/cm$^2$. In the SEM photo, the etching area is 6 mm×6 mm, the etching depth is about 2 μm and the variance of the roughness is only 5%. The thickness of the n$^-$-GaN layer, of which the doping concentration is 10 cm$^{17}$ cm$^{-3}$, is about 2.5 μm. The initial growth quality of the epitaxial layer is affected by the defects caused by the strain of the sapphire substrate. As a result, the smoothness of the etching surface is not degraded until etching the bottom of the epitaxial layer. However, the smoothness variance of the etching surface is only about 5%, which is still superior to the 20–80% obtained in the prior art.

Moreover, according to the etching method of this invention, no voltage bias is required, the etching rate can be varied between 25 nm/min and 400 nm/min by adjusting the illuminating intensity and the illuminated area with no bias. Therefore, the etching method of this invention is suitable for mass production and can easily be implemented.

Figure 5:
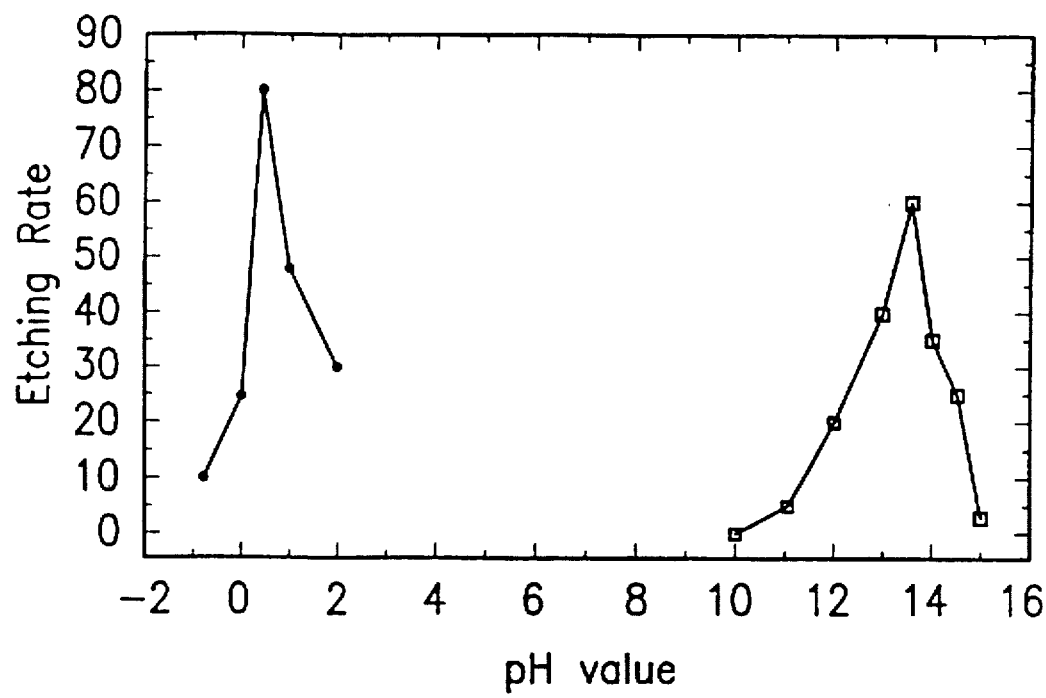
FIG. 5 is a diagram illustrating the relation of the etching rate and the pH value of the electrolysis liquid used in the present invention.

FIG. 5 illustrates the relation of etching rate and pH value of the electrolysis liquid used in the present invention. The effective working range of the pH value for the electrolysis liquid is greater than 11 or less than 3 in the FIG. 5. Curve A indicates that the electrolysis liquid is made of KOH, while Curve B indicates that the electrolysis liquid is $H_3PO_4$. The oxide of GaN generated by the reaction due to illumination can be effectively dissolved into the electrolysis liquid. As shown in FIG. 5, the etching is accomplished when the power density of the light source is 10 mW/cm$^2$ and the ratio of the illuminated area to non-illuminated area of the nitride chip is 5:1. The etching rate rises to 80 nm/min when the pH value of the electrolysis liquid is 0.5.

Figure 6:
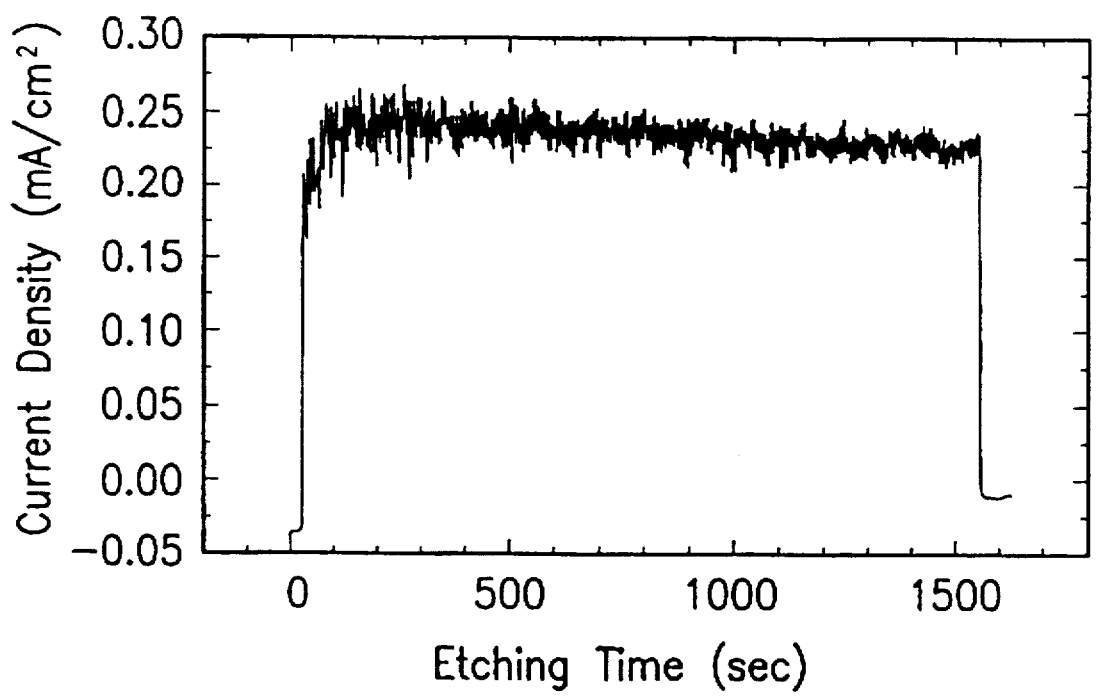
FIG. 6 is a diagram illustrating the relation of the etching time and the current density of the in-situ monitoring current according to the present invention.

Referring to FIG. 6, the GaN chip is dipped into KOH solution having a pH value of 11. In FIG. 6, the illuminating time is about 1500 seconds and the current monitoring time is 1600 seconds. A stable etching current is measured only when the GaN chip is illuminated by 254 nm UV light. The etching current falls to zero as soon as the light source is turned off. Accordingly, if the etching current reading and the etching depth are corrected corresponding to an electrolysis liquid having a certain pH value, the etching method of this invention can be used to in-situ monitor the etching rate.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives that have been discussed above and all equivalents thereto.

What is claimed is:

1. A method for etching nitride, comprising the steps of:

(i) coating a first electrode on a nitride chip;

(ii) mounting the nitride chip on a holding device;

(iii) dipping the holding device, the nitride chip and the first electrode in electrolysis liquid;

(iv) irradiating the nitride chip with a UV light having a wavelength shorter than 254 nm; and (v) connecting the first electrode to a second electrode dipped in the electrolysis liquid by a galvanometer to in-situ monitor the etching current, so as to in-situ control the etching depth.

2. A method as claimed in claim 1, wherein the nitride chip is gallium nitride.

3. A method as claimed in claim 1, wherein the pH value of the electrolysis liquid is greater than 11.

4. A method as claimed in claim 1, wherein the pH value of the electrolysis liquid is less than 3.

5. A method as claimed in claim 1, wherein the UV light is irradiated by a mercury lamp.

6. A method as claimed in claim 1, wherein the UV light is irradiated by a xenon lamp.

7. A method as claimed in claim 1, wherein the UV light is a converting output of a frequency quadrupled quasi-molecular laser.

8. A method as claimed in claim 1, wherein the UV light is irradiated by a deuterium lamp.

9. A method as claimed in claim 1, wherein the first electrode is a dual-layer electrode.

10. A method as claimed in claim 1, wherein the work function of the first electrode is larger the electronic affinity of the nitride chip.

11. A method as claimed in claim 3, wherein the electrolysis liquid is KOH.

12. A method as claimed in claim 4, wherein the electrolysis liquid is $H_3PO_4$.

13. A method as claimed in claim 7, wherein the quasi-molecular laser is a YAG laser.

14. A method as claimed in claim 9, wherein the dual electrode comprises an inner electrode and an outer electrode, in which the outer electrode is made of one of Re, Pt, Ru, Rh, Pd, Au, Ir and Ni and a composition thereof.

15. A method as claimed in claim 9, wherein the dual electrode comprises an inner electrode and an outer electrode, in which the inner electrode is made of one of Ti, V, Cr, Zr, Mo, Hf, Ta and W and a composition thereof.

* * * * *